(12) United States Patent
Ho et al.

(10) Patent No.: US 8,217,503 B2
(45) Date of Patent: Jul. 10, 2012

(54) PACKAGE STRUCTURE FOR DC-DC CONVERTER

(75) Inventors: Yueh-Se Ho, Sunnyvale, CA (US); Yan Xun Xue, Los Gatos, CA (US); Jun Lu, San Jose, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 137 days.

(21) Appl. No.: 12/881,372

(22) Filed: Sep. 14, 2010

(65) Prior Publication Data

US 2012/0061813 A1 Mar. 15, 2012

(51) Int. Cl.
*H01L 21/00* (2006.01)
*H01L 23/02* (2006.01)
(52) U.S. Cl. .......................... 257/686; 257/666; 438/110
(58) Field of Classification Search .................. 257/666, 257/676, 777, 686, 723, 724; 438/107, 109, 438/110
See application file for complete search history.

(56) References Cited

U.S. PATENT DOCUMENTS

| 7,026,664 | B2 * | 4/2006 | Divakar et al. | 257/107 |
| 7,923,300 | B2 * | 4/2011 | Bell et al. | 438/123 |
| 2009/0117690 | A1 * | 5/2009 | Joshi et al. | 438/123 |
| 2011/0024884 | A1 * | 2/2011 | Xue et al. | 257/676 |
| 2011/0121808 | A1 * | 5/2011 | Girdhar et al. | 323/311 |
| 2011/0227207 | A1 * | 9/2011 | Yilmaz et al. | 257/676 |
| 2011/0309454 | A1 * | 12/2011 | Ho et al. | 257/392 |
| 2012/0044014 | A1 * | 2/2012 | Stratakos et al. | 327/530 |

* cited by examiner

*Primary Examiner* — Sheila V Clark
(74) *Attorney, Agent, or Firm* — Chein-Hwa Tsao; C H Emily LLC

(57) ABSTRACT

A package structure for DC-DC converter disclosed herein can reduce the number of encapsulated elements as a low-side MOSFET chip can be stacked above the high-side MOSFET chip of a first die pad, through die pads of different thicknesses or interposers with joint parts of different thicknesses; moreover, it further reduces the size of the entire semiconductor package as a number of bond wires are contained in the space between the controller and the low-side MOSFET chip. Moreover, electrical connection between the top source electrode pin and the bottom source electrode pin of the low-side MOSFET chip is realized with a metal joint plate, such that when the DC-DC converter is sealed with plastic, the metal joint plate can be exposed outside to improve the thermal performance and effectively reduce the thickness of the semiconductor package.

14 Claims, 9 Drawing Sheets

PACKAGE STRUCTURE FOR DC-DC CONVERTER

BACKGROUND OF THE INVENTION

1. Technical Field

The present invention relates to a semiconductor package, and more especially, to a package structure for DC-DC converter capable of encapsulating multiple elements including chips in a package.

2. Description of Related Art

In a DC-DC converter, there are usually two MOSFETs (Metal-Oxide-Semiconductor Field-Effect Transistor) used as switches. FIG. 1 shows a circuitry of DC-DC converter comprising two connected N-type MOSFETs. wherein a gate electrode G1 of a high-side MOSFET and a gate electrode G2 of a low-side MOSFET both connect to a controller; a drain electrode D1 of the high-side MOSFET (HS) connects to a Vin end, a source electrode 51 connects to a drain electrode D2 of the low-side MOSFET (LS), and a source electrode S2 of the low-side MOSFET connects to a Gnd end, composing the DC-DC converter. Usually parts including capacitor and inductor are set between the Vin end and Gnd end of the DC-DC converter.

As shown in FIG. 2, a DC-DC converter package encapsulates a high-side MOSFET chip, a low-side MOSFET chip and a controller in one package, reducing the number of component count and improving the efficiency of the power supply.

However, for an actual package, the said high-side MOSFET chip, low-side MOSFET chip, and controller are set parallel on a same plane of the lead frame, therefore the installation space of the package limits the size of the high-side MOSFET chip, the low-side MOSFET chip and the controller chip to a large extent, which greatly limits the performance improvement of the DC-DC converter.

BRIEF SUMMARY OF THE INVENTION

The present invention aims at providing a DC-DC converter package not only capable of encapsulating multiple elements including semiconductor chips in a package so as to reduce the assembly components of the DC-DC converter and the size of the entire semiconductor DC-DC converter, but also capable of increasing the size of chips and controller in a given package size thus effectively improving the performance of the semiconductor apparatus.

To achieve the abovementioned purpose, the present invention provides a DC-DC converter package comprising:

a high-side MOSFET chip and a low-side MOSFET chip respectively having a bottom drain electrode, a top gate electrode and a top source electrode;

a lead frame having a first die pad and a second die pad, the first die pad having a first portion and a second portion wherein said high-side MOSFET chip being disposed on the first portion of the first die pad with its bottom drain electrode electrically connected with the first die pad;

a controller disposed on the second portion of the first die pad and being electrically connected with the top gate electrode of the high-side MOSFET chip;

a conductive interposer disposed on top of the second die pad and at least a portion of the high-side MOSFET chip and being electrically connected with the top source electrode of the high-side MOSFET chip, wherein said interposer does not cover the controller;

wherein the low-side MOSFET chip being disposed on the interposer with its top gate electrode electrically connected with the controller and its bottom drain electrode electrically connected with the top source electrode of the high-side MOSFET chip, wherein the low side MOSFET chip extending beyond an edge of the conductive interposer hanging over at least a portion of the controller.

In a preferred embodiment of the present invention, the second die pad is thicker than the first die pad with a difference in thickness substantially the same as a thickness the high-side MOSFET chip.

In another preferred embodiment the conductive interposer comprises a first part and a second part thicker than the first part thus forming a step structure with the step substantially the same as a thickness of the high-side MOSFET, wherein the second part being disposed on the second die pad and the first part being disposed on the high-side MOSFET chip.

A method of making a DC-DC converter package according to current invention is also provided comprising the following steps:

providing a lead frame having a first die pad (11) and a second die pad (12), the first die pad having a first portion and a second portion;

disposing a high-side MOSFET chip (21) having a bottom drain electrode, a top gate electrode and a top source electrode on the first portion of the first die pad (11) with its bottom drain electrode electrically connected with the first die pad (11);

disposing a controller (40) on the second portion of the first die pad (11);

electrically connecting a first gate control electrode of the controller to the top gate electrode of the high-side MOSFET chip (21) and a second gate control electrode of the controller to a low-side gate pin on the lead frame;

disposing a conductive interposer (30) on top of the second die pad (12) and at least a portion of the high-side MOSFET chip (21) and electrically connecting conductive interposer with the top source electrode (211) of the high-side MOSFET chip (21) and the second die pad;

disposing a low-side MOSFET chip (22) having a bottom drain electrode, a top gate electrode and a top source electrode on top of the interposer (30) with its bottom drain electrode electrically connected with the conductive interposer;

electrically connecting the top gate electrode of the low-side MOSFET to the low-side gate pin on the lead frame.

BRIEF DESCRIPTION OF THE SEVERAL VIEWS OF THE DRAWINGS

Wherein FIG. 4, FIG. 7, FIG. 10, and FIG. 13 are the top views in each assembly step of the package described in Embodiment 1;

FIG. 5, FIG. 8, FIG. 11, and FIG. 14 are respectively sectional views of FIG. 4, FIG. 7, FIG. 10, and FIG. 13 in A-A' direction.

FIG. 6, FIG. 9, FIG. 12, and FIG. 15 are respectively sectional views of FIG. 4, FIG. 7, FIG. 10, and FIG. 13 in B-B' direction.

DETAILED DESCRIPTION OF THE INVENTION

The following is a detailed description of some preferred embodiments of the present invention with reference to the figures from FIG. 3 to FIG. 18.

Figure 1:
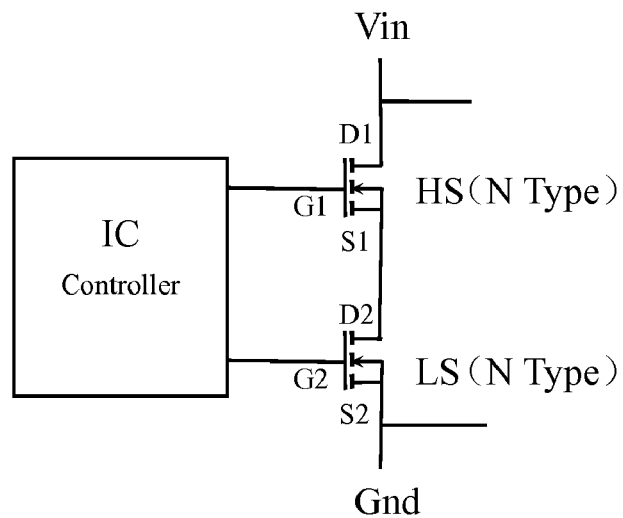
FIG. 1 is a circuit diagram of the DC-DC converter.

As shown in FIG. 1, the DC-DC converter provided by the present invention uses two MOSFET chips of the same type as a high-side MOSFET chip and a low-side MOSFET chip, connected with a controller or other elements and encapsulated in a package to form an independent semiconductor apparatus.

The two MOSFET chips can be two N-type or P-type MOSFET chips. However, N-type MOSFET chip can use a smaller size for the same resistance or provides better resistance than the P-type MOSFET chip when using the same chip size, therefore, two N-type MOSFET chips are used in the preferred embodiments. It shall be noted that the protection range of the present invention is not limited to the detailed descriptions and embodiments.

The high-side MOSFET chip has a smaller size than the low-side MOSFET chip. Both the high-side and low-side MOSFET chips have a bottom drain electrode, a top source electrode and a top gate electrode, wherein both the gate electrode G1 of the high-side MOSFET and the gate electrode G2 of the low-side MOSFET are connected to a controller; the drain electrode D1 of the high-side MOSFET (HS) connects to a Vin end, the source electrode S1 connects to the drain electrode D2 of the low-side MOSFET (LS), the source electrode S2 of the low-side MOSFET connects to a Gnd end, and forms the DC-DC converter. Elements including the capacitor and inductor can be set between the Vin end and Gnd end of the DC-DC converter.

Embodiment 1

Figure 3:
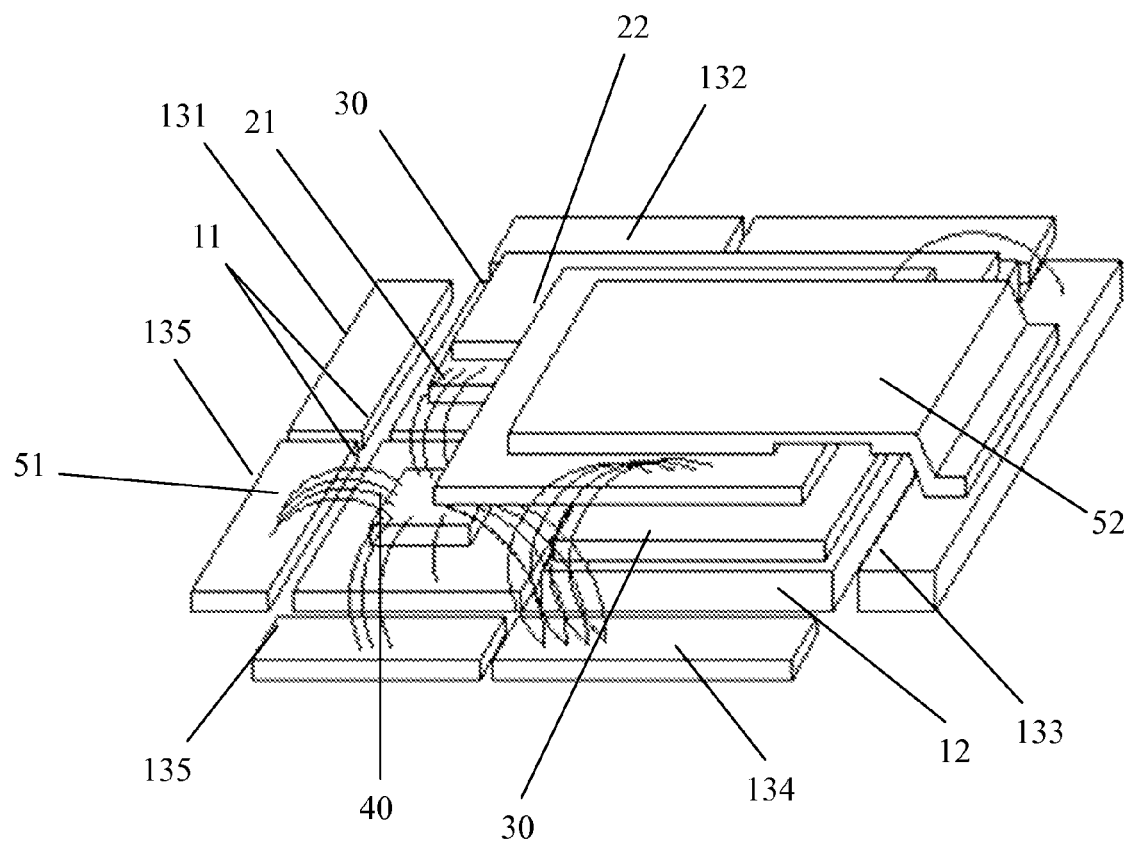
FIG. 3 is a schematic view of the overall structure of the DC-DC converter package described in Embodiment 1 of the present invention.

FIG. 3 is a schematic view of the DC-DC converter package described in the present embodiment. The package contains a lead frame. A first die pad 11 having a first portion and a second portion and a second die pad 12 of difference thickness are set in the same plane on the lead frame, and it is provided that the second die pad 12 is thicker than the first die pad 11. In the preferred embodiment, the first portion and the second portion of first die pad 11 are separated from each other. Alternatively they can be joined together.

A number of pins, including low-side source electrode pins 133, low-side gate electrode pins 134, high-side source electrode pins 131, high-side gate electrode pins 132 and control pins 135, which are separated from and have no electrical connection with the first and second die pads, are set in the lead frame.

Figure 4:
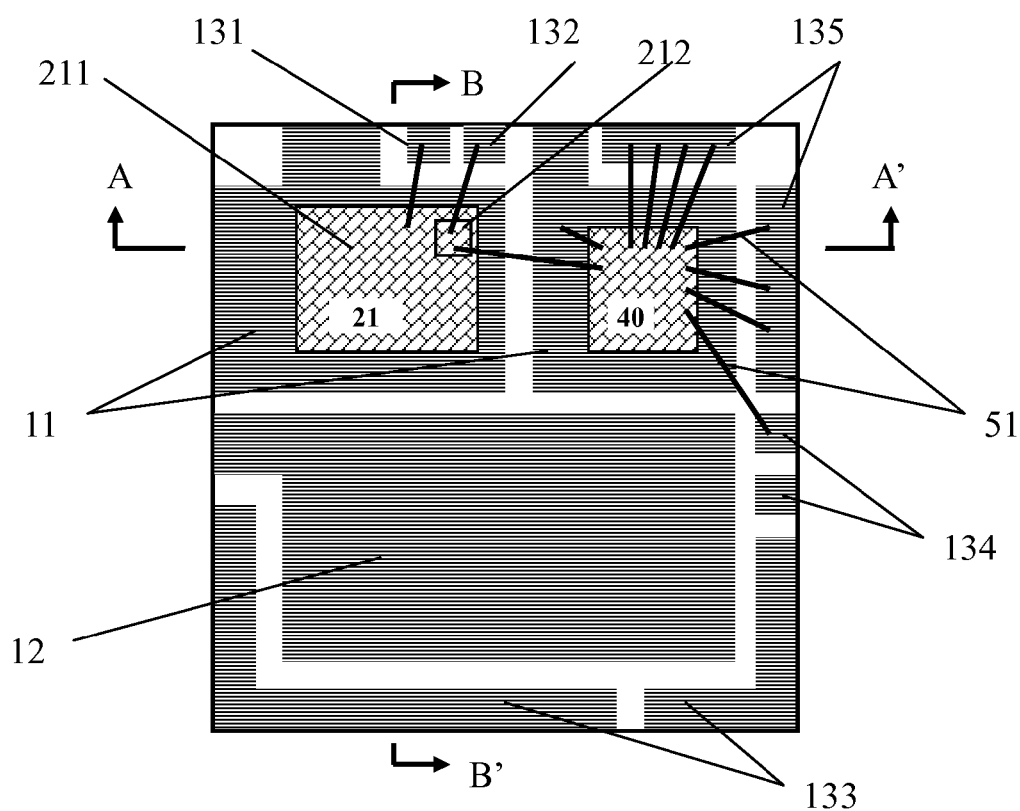
FIGS. 4~FIG. 15 are the top and cross sectional views in each assembly step of the DC-DC converter package described in Embodiment 1 of the present invention.
Figure 5:
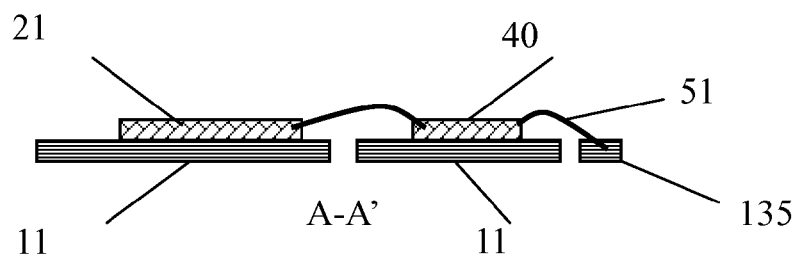
Figure 6:
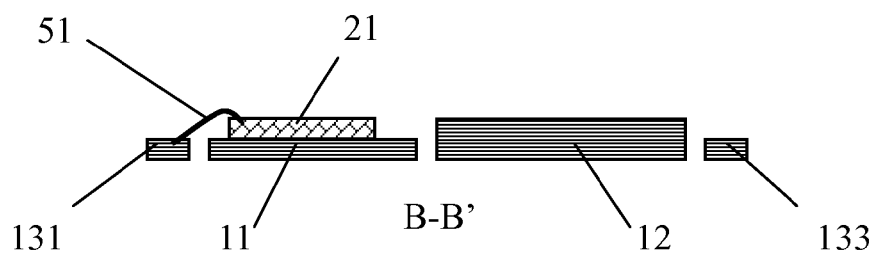

Please refer to FIG. 3 in combination with the top view shown in FIG. 4. FIG. 5 is a sectional view of FIG. 4 in A-A' direction, and FIG. 6 is a sectional view of FIG. 4 in B-B' direction.

Attach the high-side MOSFET chip 21 of smaller size to the first portion of first die pad 11, make its bottom drain electrode (it is not shown in the figure) electrically connected with the first die pad 11, and respectively make its top source electrode 211 and top gate electrode 212 electrically connected with the high-side source electrode pin 131 and the high-side gate electrode pin 132 with a number of bond wires 51.

Attach the controller 40 to the second portion of first die pad 11, make a plurality of the control electrodes of the controller 40 electrically connected with the second portion of first die pad 11, a number of controller pins 135, low-side gate electrode pins 134, and the top gate electrode 212 of the high-side MOSFET chip 21 with a number of bond wires 51. Specifically a first control electrode of the controller is electrically connected to the top gate electrode 212 of the high-side MOSFET chip 21 and a second control electrode of the controller is electrically connected to the low-side gate electrode pin 134 on the lead frame.

Figure 7:
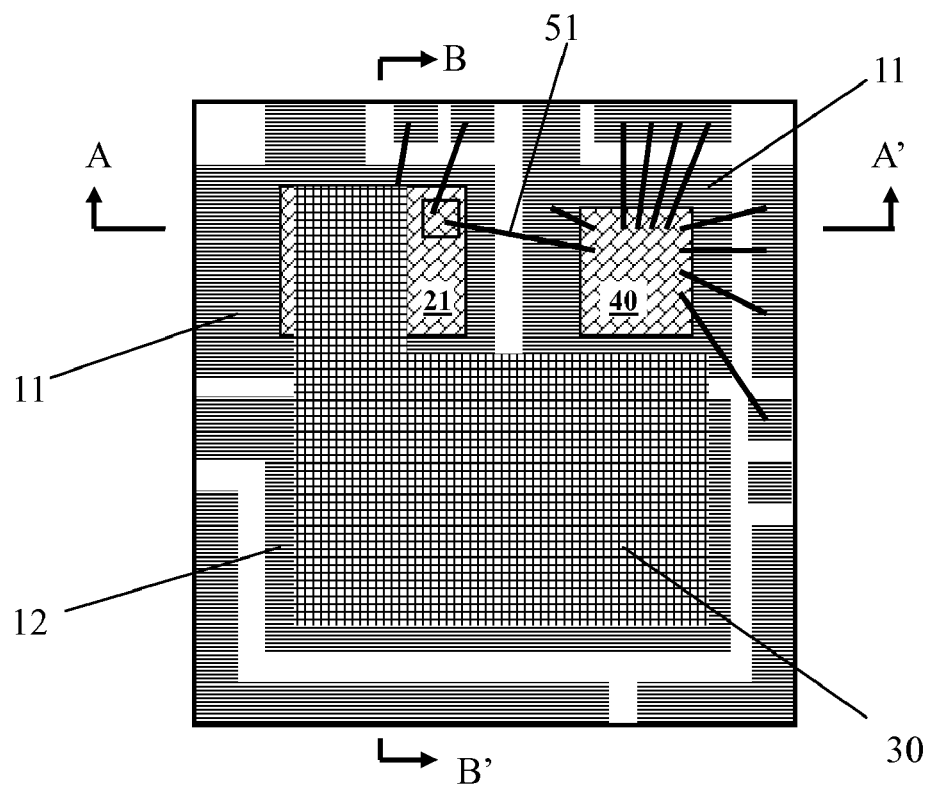
Figure 8:
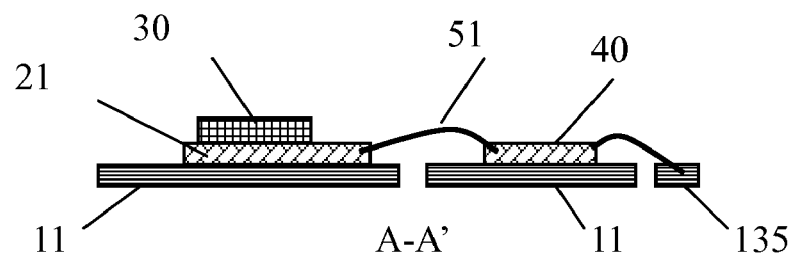
Figure 9:
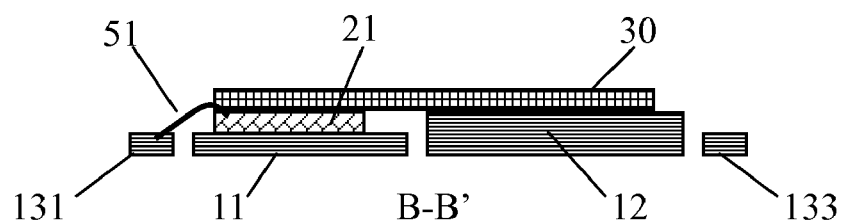

Please refer to FIG. 3 in combination with the top view shown in FIG. 7. FIG. 8 is a sectional view of FIG. 7 in A-A' direction, and FIG. 9 is a sectional view of FIG. 7 in B-B' direction.

The second die pad 12 is substantially coplanar to the top surface of the high-side MOSFET chip 21 stacked on top of the first die pad 11. Attach a conductive interposer 30 on the second die pad 12 and high-side MOSFET chip 21, with the bottom of the interposer 30 cover only a part of the top of the high-side MOSFET chip 21, and make it electrically connected with the top source electrode 211 of the high-side MOSFET chip 21 (FIG. 8). The conductive interposer is arranged to leave the gate area of high side MOSFET chip 21 and the control IC chip uncover without disturbing the bond wire connections between the control IC chip and the high side MOSFET chip 21. The thickness of conductive interposer 30 is designed such that a top surface of the conductive interposer 30 is substantially higher than the highest point of the bonding wires.

Figure 10:
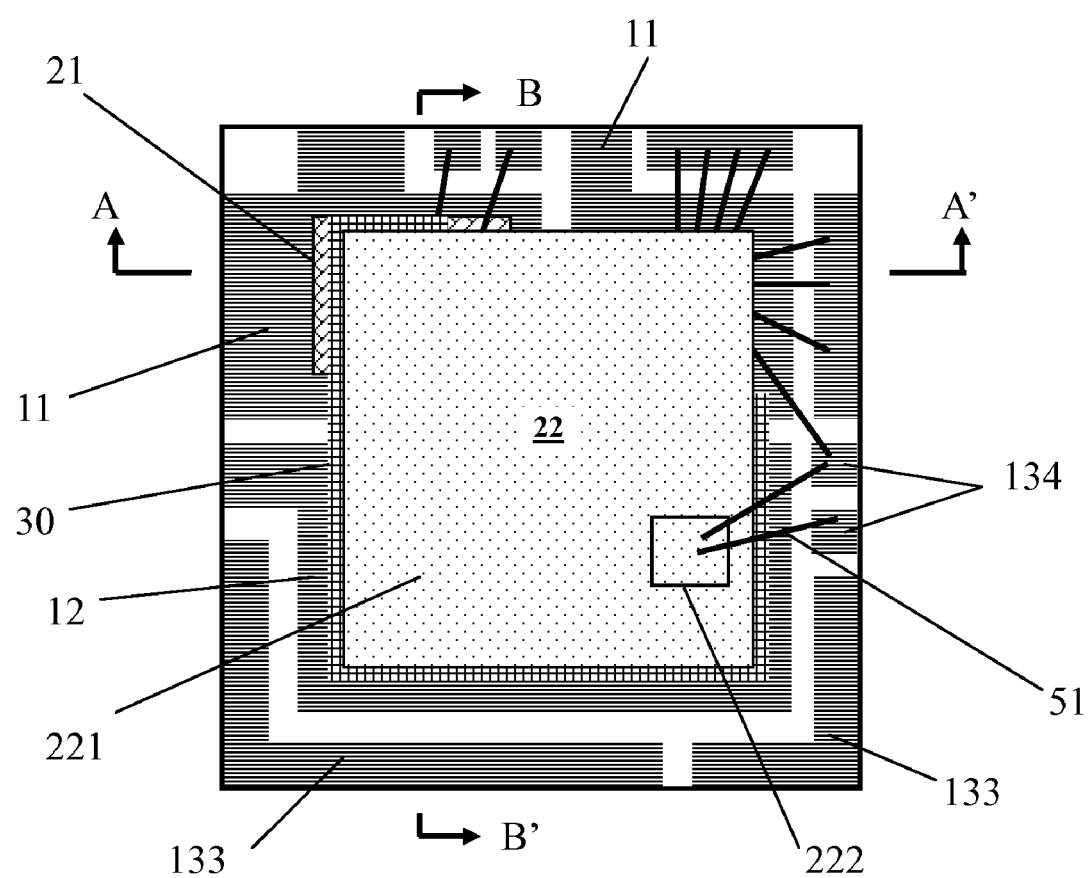
Figure 11:
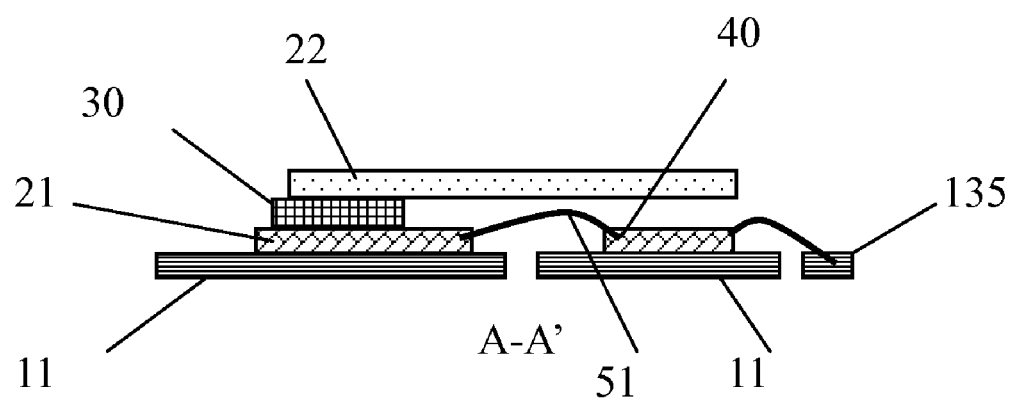
Figure 12:
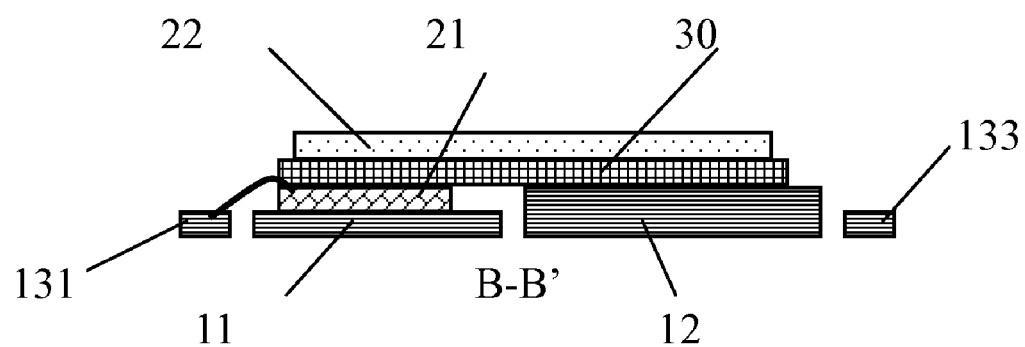

Please refer to FIG. 3 in combination with the top view shown in FIG. 10. FIG. 11 is a sectional view of FIG. 10 in A-A' direction, and FIG. 12 is a sectional view of FIG. 10 in B-B' direction.

Attach the low-side MOSFET chip 22 of bigger size to the top surface of the interposer 30, and make its bottom drain electrode electrically connected with the interposer 30, so as to make the source electrode of the high-side MOSFET chip 21 electrically connected with the drain electrode of the low-side MOSFET chip 22 as shown in FIG. 1.

The low-side MOSFET chip 22 is set on the interposer 30 and extends beyond an edge of the interposer 30 covering a part of the area above the high-side MOSFET chip 21 and the controller 40 (FIG. 10). As the thickness of interposer 30 is high enough, a number of bond wires 51 linking the connection controller 40 and the high-side MOSFET chip 21 or the controller pins 135 are contained in the space above the controller 40 and between the low-side MOSFET chip 22 (FIG. 11).

On the low-side MOSFET chip 22, make the top gate electrode 222 electrically connected with the low-side gate electrode pins 134 in the lead frame with a number of bond wires 51'. As shown in FIG. 4, FIG. 7 and FIG. 10, the low-side MOSFET chip 22 and the controller 40 are electrically connected with the low-side gate electrode pins 134 respectively, and form the electrical connection between the gate electrode of the low-side MOSFET chip 22 and the controller 40 as shown in FIG. 1. The bond wire 51 connecting the controller 40 to the low side gate electrode pins 134 is substantially below the low side MOSFET chip while the bond wire 51' connecting the low side MOSFET gate to the low side MOSFET gate electrode pins 134 extends above the low side MOSFET chip.

Figure 13:
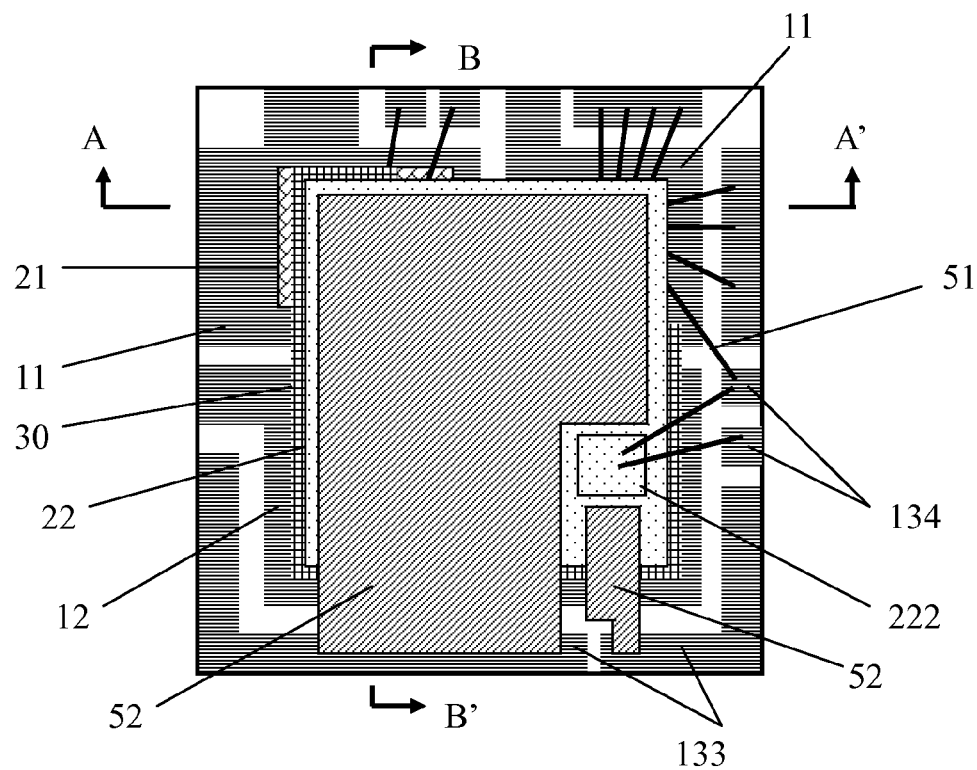
Figure 14:
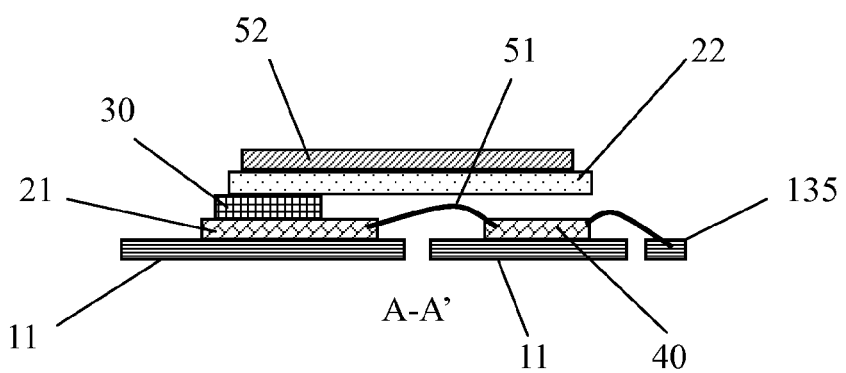
Figure 15:
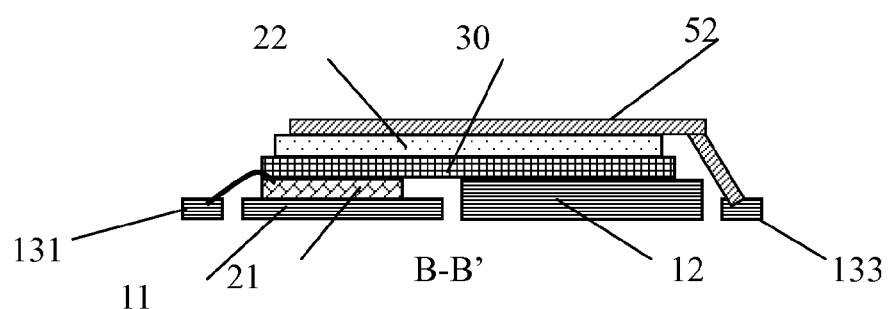

Please refer to FIG. 3 in combination with the top view shown in FIG. 13. FIG. 14 is a sectional view of FIG. 13 in A-A' direction, and FIG. 15 is a sectional view of FIG. 13 in B-B' direction.

Use the metal joint plate 52 (or other metal joint elements including metal ribbon) to make the top source electrode 221 of the low-side MOSFET chip 22 electrically connected with the low-side source electrode 133 (FIG. 13), so that the bottom of the package can be exposed outside to connect the Vin end after the entire stacked package structure is sealed with plastic, and also the top surface of the metal joint plate 52 can be exposed outside to connect the Gnd end, so as to improve the thermal performance and effectively reduce the thickness of the semiconductor package.

Embodiment 2

As shown in the top view (FIG. 16), the sectional view in A-A' direction (FIG. 17) and the sectional view in B-B' direction (FIG. 18), the package structure for DC-DC converter described in the present embodiment, has a stack structure similar to Embodiment 1, that is, the high-side MOSFET chip 21 and the controller 40 are respectively adhered to the first die pad 11 on the top of the lead frame.

The high-side MOSFET chip 21 is in linkage with a number of bond wires 51, and has electrical connections respectively between its top gate electrode and high-side gate electrode pins 132, and its top source electrode and high-side source electrode pins 131. The controller 40 is in linkage with a number of bond wires 51, and is electrically connected with the first die pad 11, a number of control pins 135, low-side gate electrode pins 134, and the top gate electrode of the high-side MOSFET chip 21 respectively.

Set the conductive interposer 30 on the top of the second die pad 12 and high-side MOSFET chip 21 in the lead frame, set the low-side MOSFET chip 22 on the interposer 30, and use the interposer 30 to make the top source electrode of the high-side MOSFET chip 21 electrically connected with the bottom drain electrode of the low-side MOSFET chip 22.

Different from the abovementioned Embodiment 1, in the present embodiment the first die pad 11 is the same thickness as the second die pad 12 on the lead frame.

The interposer 30 comprises an incorporated first part 31 and a second part 32 which is thicker than the first part 31 forming a step structure, with the step substantially about the thickness of the high side MOSFET chip 21. When stuck the first part 31 to the high-side MOSFET chip 21 on the first die pad 11 and the second part 32 to the top surface of the second die pad 12, a top surface of the interposer 30 is substantially level. Through the first part 31, the top source electrode of the high-side MOSFET chip 21 is electrically connected with the bottom drain electrode of the low-side MOSFET chip 22.

Figure 16:
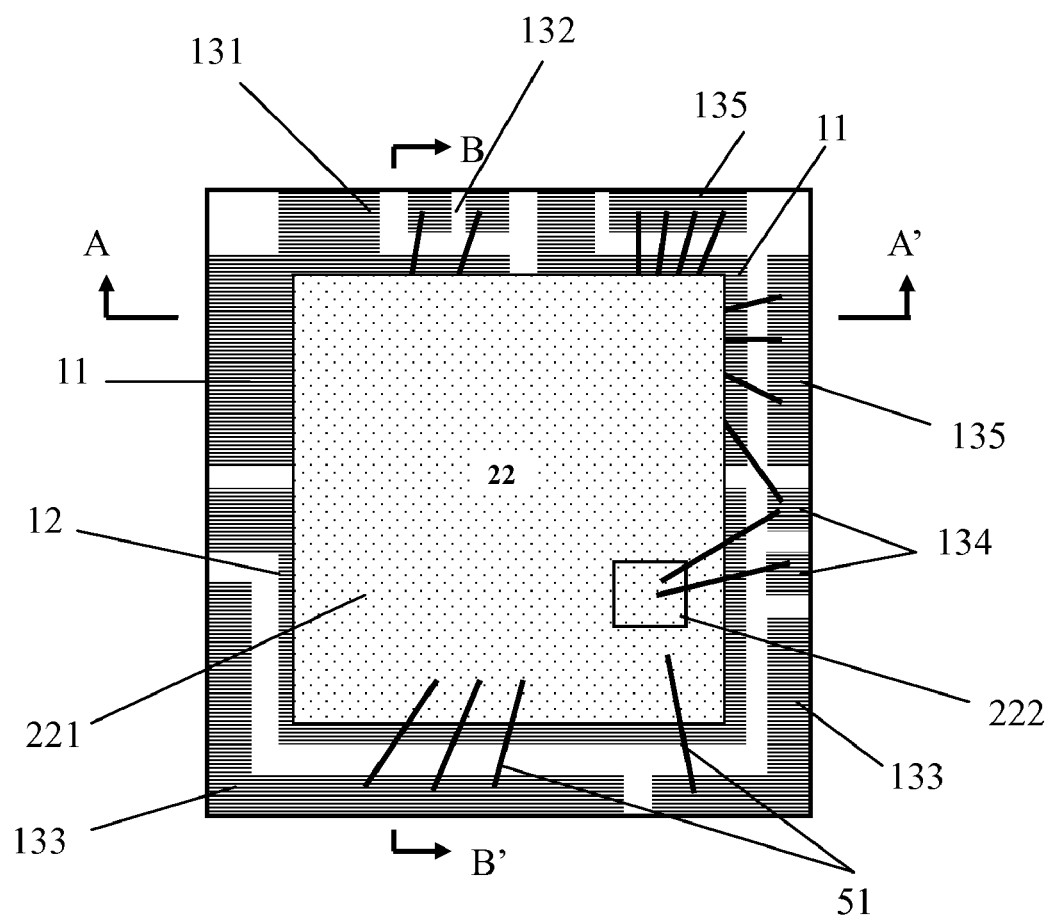
FIG. 16 is a top view of the DC-DC converter package described in Embodiment 2 of the present invention.

Compared with the structure shown in FIG. 10 and FIG. 16, in the present embodiment the low-side MOSFET chip 22 attached on the interposer 30 is extended to cover or exceed the entire area above the high-side MOSFET chip 21 and the controller 40. Therefore, in the lead frame of the same size, the size of the low-side MOSFET chip 22 can be increased sufficiently to improve the performance of the semiconductor apparatus.

Figure 17:
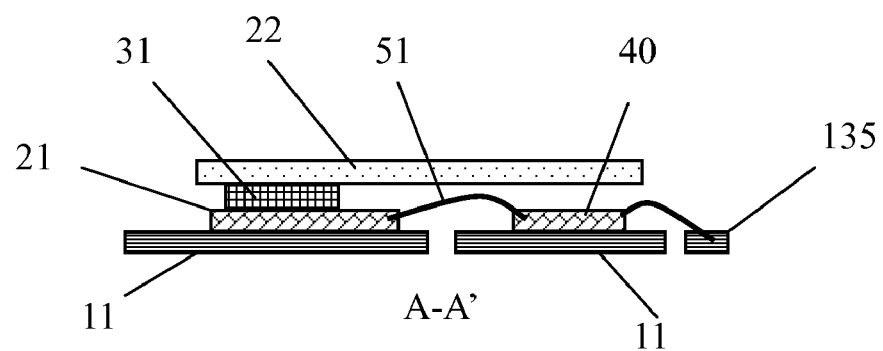
FIG. 17 is a sectional view of FIG. 16 in A-A' direction.
Figure 18:
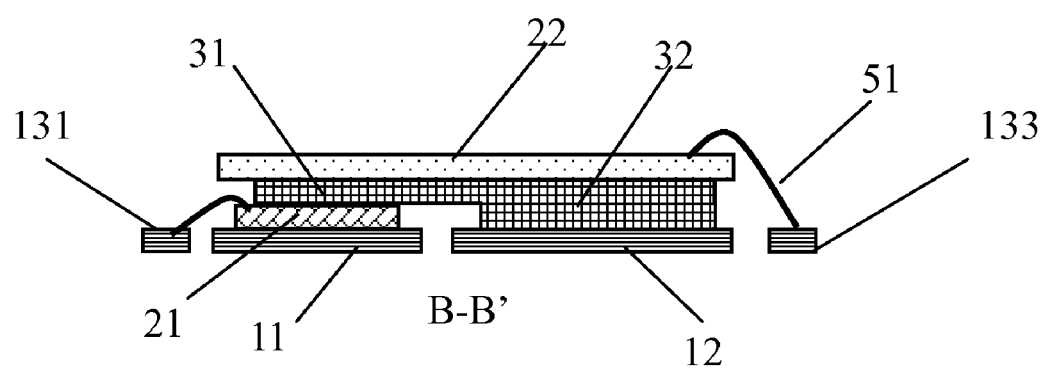
FIG. 18 is a sectional view of FIG. 16 in B-B' direction.

As shown in FIG. 17, as the first part 31 does not cover the controller 40, a number of bond wires 51 linking the controller 40, high-side MOSFET chip 21 and a number of pins can be contained in the space above the controller 40 and between the low-side MOSFET chip 22.

In the present embodiment, on the low-side MOSFET chip 22, the top gate electrode 222 is electrically connected with the low-side gate electrode pins 134 and the top source electrode 221 is electrically connected to the low-side source electrode pin 133 with a number of bond wires 51'. Alternatively the top source electrode 221 may be electrically connected to the low-side source electrode pin 133 with a metal plate or ribbon.

In some preferred embodiments, metal joint elements including metal joint plate 52 and metal joint ribbon as shown in FIG. 13 can be used to make the top source electrode 221 of the low-side MOSFET chip 22 electrically connected with the low-side source electrode pin 133. When encapsulated, the metal joint element can be exposed outside to improve the thermal performance and effectively reduce the thickness of the semiconductor package.

In conclusion, the present invention uses the first and second die pad of different thicknesses, or the interposer 30 with joint parts of different thicknesses to provide a leveled top surface of interposer 30 for the low-side MOSFET chip 22 to be stacked above the high-side MOSFET chip 21 disposed on the first die pad 11 such that the top source electrode 211 of the high-side MOSFET chip 21 connects with the bottom drain electrode of the low-side MOSFET chip 22 through the interposer 30. so as to reduce the number of elements of the DC-DC converter to be assembled. A number of bond wires 51 linking the connection controller 40 and the high-side MOSFET chip 21 or a number of pins are contained in the space above the controller 40 of the first die pad 11 and between the low-side MOSFET chip 22. In this way, it further reduces the size of the entire semiconductor capsule.

Figure 2:
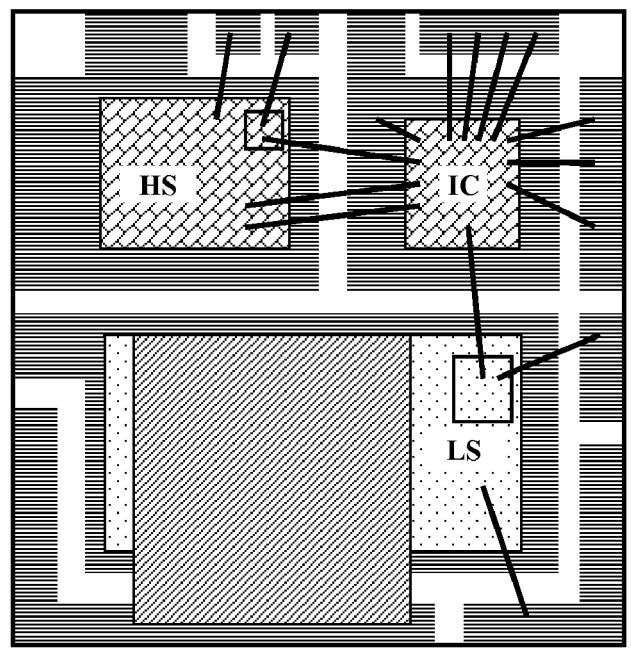
FIG. 2 is a schematic view of the prior art package structure for DC-DC converter.

As the present invention adopts the package structure in which the low-side MOSFET chip 22 is stacked above the high-side MOSFET chip 21 and the controller 40 through the interposer 30, comparing with the structure of the prior art in which the high-side and low-side MOSFET chip 22 and the controller 40 are side by side disposed on the lead frame as shown in FIG. 2, in the lead frame of the same size, each element in the present embodiment can be extended to effectively improve the performance of the semiconductor apparatus, for example, the size of the low-side MOSFET chip 22 can be increased to cover the entire area above the high-side MOSFET chip 21 and the controller 40.

Moreover, the present invention uses metal joint elements including metal joint plate 52 and metal joint ribbon to make the top source electrode of the low-side MOSFET chip 22 electrically connected with the low-side source electrode pin 133. When the DC-DC converter is sealed with plastic, the metal joint plate 52 can be exposed outside to improve the thermal performance and effectively reduce the thickness of the semiconductor package.

The above preferred embodiments provide detail description of the present. However, it shall be noted that the protection range of the present invention is not limited to the abovementioned description. It is obvious that there could be many modifications and replacements with regard to the present invention after the skilled in the art read the abovementioned contents. Therefore, the protection range of the present invention shall be defined by the attached claims.

What is claimed is:
1. A package structure for DC-DC converter, comprising:
a high-side MOSFET chip (21) and a low-side MOSFET chip (22) respectively having a bottom drain electrode, a top gate electrode and a top source electrode;
a lead frame having a first die pad (11) and a second die pad (12), the first die pad having a first portion and a second portion wherein said high-side MOSFET chip (21) being disposed on the first portion of the first die pad (11) with its bottom drain electrode electrically connected with the first die pad (11);

a controller (40) disposed on the second portion of the first die pad (11) and being electrically connected with the top gate electrode of the high-side MOSFET chip (21);

a conductive interposer (30) disposed on top of the second die pad (12) and at least a portion of the high-side MOSFET chip (21) and being electrically connected with the top source electrode (211) of the high-side MOSFET chip (21), wherein said interposer (30) does not cover the controller (40);

wherein the low-side MOSFET chip (22) being disposed on the interposer (30) with its top gate electrode electrically connected with the controller (40) and its bottom drain electrode electrically connected with the top source electrode (211) of the high-side MOSFET chip (21), wherein the low side MOSFET chip extending beyond an edge of the conductive interposer hanging over at least a portion of the controller.

2. The package structure of claim 1, wherein the second die pad (12) being thicker than the first die pad (11) with a difference in thickness substantially the same as a thickness the high-side MOSFET chip (21).

3. The package structure of claim 1, wherein the conductive interposer (30) comprises a first part (31) and a second part (32) thicker than the first part (31) thus forming a step structure with the step substantially the same as a thickness of the high-side MOSFET; wherein the second part (32) being disposed on the second die pad (12) and the first part (31) being disposed on the high-side MOSFET chip (21).

4. The package structure of claim 1, further comprising a bond wire disposed in a space under the overhanging portion of the low-side MOSFET chip for electrically connecting the top gate electrode of the high-side MOSFET and the controller.

5. The package structure of claim 1, wherein the lead frame further comprises a low-side gate pin, a first bond wire connecting the controller to the low-side gate pin and a second bond wire connecting the top gate electrode of the low-side MOSFET to the low-side gate pin.

6. The package structure of claim 1, wherein the first portion and the second portion of the first die pad are separated from each other.

7. A package structure for DC-DC converter, comprising:
a high-side MOSFET chip (21) and a low-side MOSFET chip (22) respectively having a bottom drain electrode, a top gate electrode and a top source electrode;
a lead frame having a first die pad (11) and a second die pad (12), the first die pad having a first portion and a second portion wherein said high-side MOSFET chip (21) being disposed on the first portion of the first die pad (11) with its bottom drain electrode electrically connected with the first die pad (11);
a controller (40) disposed on the second portion of the first die pad (11) and being electrically connected with the top gate electrode of the high-side MOSFET chip (21);
a conductive interposer (30) comprising a first part (31) and a second part (32) thicker than the first part (31) thus forming a step structure with the step substantially the same as a thickness of the high-side MOSFET, wherein the second part (32) being disposed on the second die pad (12) and the first part (31) being disposed on the high-side MOSFET chip (21) electrically connected with the top source electrode (211) of the high-side MOSFET chip (21);
wherein the low-side MOSFET chip (22) being disposed on top of the interposer (30) with its top gate electrode electrically connected with the controller (40) and its bottom drain electrode electrically connected with the top source electrode (211) of the high-side MOSFET chip (21).

8. The package structure of claim 7 wherein said interposer (30) does not cover the controller (40) and the low side MOSFET chip extends beyond an edge of the conductive interposer hanging over at least a portion of the controller.

9. A package structure for DC-DC converter, comprising:
a high-side MOSFET chip (21) and a low-side MOSFET chip (22) respectively having a bottom drain electrode, a top gate electrode and a top source electrode;
a lead frame having a first die pad (11) and a second die pad (12), the first die pad having a first portion and a second portion wherein said high-side MOSFET chip (21) being disposed on the first portion of the first die pad (11) with its bottom drain electrode electrically connected with the first die pad (11), wherein the second die pad (12) being thicker than the first die pad (11) with a difference in thickness substantially the same as a thickness the high-side MOSFET chip (21);
a controller (40) disposed on the second portion of the first die pad (11) and being electrically connected with the top gate electrode of the high-side MOSFET chip (21);
a conductive interposer (30) disposed on top of the second die pad (12) and at least a portion of the high-side MOSFET chip (21) and being electrically connected with the top source electrode (211) of the high-side MOSFET chip (21);
wherein the low-side MOSFET chip (22) being disposed on the interposer (30) with its top gate electrode electrically connected with the controller (40) and its bottom drain electrode electrically connected with the top source electrode (211) of the high-side MOSFET chip (21).

10. A method for packaging a DC-DC converter, comprising:
Providing a lead frame having a first die pad (11) and a second die pad (12), the first die pad having a first portion and a second portion;
disposing a high-side MOSFET chip (21) having a bottom drain electrode, a top gate electrode and a top source electrode on the first portion of the first die pad (11) with its bottom drain electrode electrically connected with the first die pad (11);
disposing a controller (40) on the second portion of the first die pad (11);
electrically connecting a first gate control electrode of the controller to the top gate electrode of the high-side MOSFET chip (21) and a second gate control electrode of the controller to a low-side gate pin on the lead frame;
disposing a conductive interposer (30) on top of the second die pad (12) and at least a portion of the high-side MOSFET chip (21) and electrically connecting conductive interposer with the top source electrode (211) of the high-side MOSFET chip (21) and the second die pad;
disposing a low-side MOSFET chip (22) having a bottom drain electrode, a top gate electrode and a top source electrode on top of the interposer (30) with its bottom drain electrode electrically connected with the conductive interposer;
electrically connecting the top gate electrode of the low-side MOSFET to the low-side gate pin on the lead frame.

11. The method of claim 10, wherein the second die pad (12) being provided thicker than the first die pad (11) with a difference in thickness substantially the same as a thickness the high-side MOSFET chip (21).

12. The method of claim 10, wherein the conductive interposer (30) comprises a first part (31) disposed on the high-side MOSFET chip (21) and a second part (32) disposed on the second die pad (12), the second part being thicker than the first part (31) thus forming a step structure with the step substantially the same as a thickness of the high-side MOSFET.

13. The method of claim 10, wherein the first portion and the second portion of the first die pad are separated from each other.

14. The method of claim 10, wherein the step of disposing the low-side MOSFET chip (22) on top of the conductive interposer further dispose the low-side MOSFET chip hanging over at least a portion of the controller.

* * * * *